United States Patent [19]

Kobayashi

[11] Patent Number: 4,597,522
[45] Date of Patent: Jul. 1, 1986

[54] WIRE BONDING METHOD AND DEVICE

[75] Inventor: Hiroaki Kobayashi, Yokohama, Japan

[73] Assignee: Kabushiki Kaisha Toshiba, Kawasaki, Japan

[21] Appl. No.: 661,739

[22] Filed: Oct. 17, 1984

[30] Foreign Application Priority Data

Dec. 26, 1983 [JP] Japan .................. 58-244120
May 9, 1984 [JP] Japan .................. 59-92025

[51] Int. Cl.⁴ .......................... B23K 31/02
[52] U.S. Cl. .................... 228/179; 228/4.5; 219/56.1; 219/56.22
[58] Field of Search ............. 228/4.5, 179; 219/56.1, 219/56.21, 56.22

[56] References Cited

U.S. PATENT DOCUMENTS

| | | | |
|---|---|---|---|
| 3,328,875 | 7/1967 | Pennings | 228/4.5 |
| 3,342,395 | 9/1967 | Diepeveen | 228/4.5 X |
| 3,695,501 | 10/1972 | Radobenko | 228/4.5 |
| 4,171,477 | 10/1979 | Funari | 228/4.5 X |
| 4,205,773 | 6/1980 | Nicklaus | 219/56.21 X |
| 4,266,710 | 5/1981 | Bilane et al. | 228/4.5 |
| 4,327,860 | 5/1982 | Kirshenboin et al. | 228/179 |

FOREIGN PATENT DOCUMENTS 58-67034 4/1983 Japan .
59-17974 4/1984 Japan .

Primary Examiner—Kuang Y. Lin
Attorney, Agent, or Firm—Schwartz, Jeffery, Schwaab, Mack, Blumenthal & Evans

[57] ABSTRACT

A wire bonding method and device in which a bonding tool for holding the leading end of a bonding wire and a wire clamp for clamping the bonding wire at a position between the bonding tool and a bonding wire supply spool are vertically moved independently of each other, thereby electrically interconnecting between a semiconductor pellet and an external terminal by means of the bonding wire. When the wire clamp is closed so as to clamp the bonding wire and is lowered by a predetermined distance, the bonding wire of a predetermined length can be extended beyond the leading end of the bonding tool. Driving mechanisms for causing the vertical movements of a bonding arm and a clamp arm are so improved that the vertical displacements of these arms are in proportion to the angle of rotation of a drive motor. The displacements of the bonding tool and the wire clamp can be directly controlled in response to the angle of rotation of the drive motor so that the complicated controls can be accomplished correctly. The velocity of the bonding tool moving from a first bonding position of the semiconductor pellet to a second bonding position of the external terminal, and the vertical shifts and shifting velocities of the bonding tool and the wire clamps are determined based on the distance between the bonding positions. Through control of the drive of them, desired loci of movement are attained.

16 Claims, 30 Drawing Figures

WIRE BONDING METHOD AND DEVICE

BACKGROUND OF THE INVENTION

The present invention relates to a wire bonding method and device for electrically interconnecting an electrode pad of a semiconductor pellet and an external terminal by means of a fine metal wire.

Recently, there have been used wire bonding devices called "digital wire bonder". These wire bonding devices use a solenoid as a wire clamp and a drive motor for vertically moving the wire clamp and a bonding tool.

FIG. 1 shows a wire bonding device of the type described above. A bonding heat unit 4 is mounted on an XY table 3 which can be displaced in the X and Y directions by means of an X-direction drive motor 1 and a Y-direction drive motor 2. The bonding head unit 4 has a bonding tool 6 through which a bonding wire 5 is passed and which is attached to a bonding arm 8 which in turn pivots about a pivotal point 7. There is also provided a swinging arm 9 pivotable about the pivotal point 7. When a shaft or eccentric pin 11 is rotated in the clockwise or counterclockwise direction by a drive motor 10, the swinging arm 9 is vertically (in the Z direction) moved. Upon vertical movement of the swinging arm 9, a clamp arm 12, a bonding arm lock pin 13 and the bonding arm 8 are caused to move vertically. The Z-direction drive motor 10 is provided with a rotary encoder (not shown) for detecting the angle of rotation and in response to the angle of rotation detected by the rotary encoder, the height of the bonding tool 6 can be detected. The pivotal point 7 is in the form of a double shaft so that both the bonding arm 8 and the swinging arm 9 can pivot about it. The motion of the swinging arm 9 is transmitted to the bonding arm 8 when an auxiliary bonding arm 15 is pressed against the bonding arm lock pin 13 by means of an arm lock solenoid 14. The auxiliary bonding arm 15 and the swinging arm 9 are also attracted with each other under the force of a linear motor 16. When the bonding arm 8 is vertically moved at a high speed, the bonding arm 8 is locked by means of the arm lock solenoid 14. When a wire is bonded, the bonding tool 6 is placed into contact with a bonding pad surface of a semiconductor pellet and the auxiliary bonding arm 15 is separated from the bonding arm lock pin 13. In this case, only a force required for bonding is applied to the auxiliary bonding arm 15 by the linear motor 16. A wire clamp 17 for clamping a bonding wire 5 and a clamp solenoid 18 are mounted on the clamp arm 12, and a wire clamp 25 and a clamp solenoid 26 are mounted on a stationary arm 27.

Referring further to FIGS. 2A and 2B, the mode of operation of the wire bonding device with the above-mentioned construction will be described. A ball is formed at the leading end of the wire 5 extended from the bonding tool 6 (time: a) and the bonding tool 6 together with the wire clamp 17 is lowered to a first bonding position A. In this case, the wire clamp 27 is closed so that friction is produced between the wire 5 and the clamp 25. As a result, the ball is clinched to the leading end of the bonding tool 6 (time: b). When the first bonding operation is accomplished, the bonding tool 6 and the wire clamp 17 are lifted by H and a desired length of wire is extracted from the bonding tool 6 (time: c). During this time, the XY table 3 is moved from the first bonding position to the second bonding position. Based upon the distance L between the first and second bonding positions, the lift H of the bonding arm 6 is determined by the following equation:

$$H = (1.5 - 2.0) \times L + \alpha$$

where $\alpha$ is determined based on experiences. Thereafter the bonding tool 6 is gradually lowered (time: d) and the wire 5 is bonded at the second bonding position (time: e). In this case, the wire clamp 25 remains clamped. Upon completion of bonding, the bonding tool 6 is lifted (time: f). The bonding tool 6 is stopped temporarily and the clamp 17 is closed so as to clamp the wire 5. The bonding tool 6 and the clamp 17 are lifted again and then wire 5 is cut off (time: g). When the bonding tool 6 is lifted, a ball is formed at the leading end of the wire by means of an $H_2O_2$ torch or an electric torch 21 (See FIG. 2B) (time: h). Thus, one bonding operation is completed.

With the above described wire bonding method and device, the length $W_1$ of the wire 5 to be bonded cannot be determined by the vertical shift H of the bonding tool 6. The reason is that the length $W_1$ of the wire 5 varies in response to various factors such as the velocity of the bonding tool 6, frictional resistance between the bonding tool 6 and the wire 5, frictional resistance between the wire clamps 17 and 27 and the wire 5, resistance encountered when the wire 5 is unrolled from a wire spool 19, the hardness of the wire 5, the buckling strength of the wire 5 and so on. As a result, the length $W_1$ of the wire 5 sometimes becomes shorter or longer than the appropriate length of wire. If the wire 5 is too short, a wire 23 is placed into contact with the corner of a semiconductor pellet 20 thereby causing a short-circuit circuit (See FIG. 3A). On the other hand, when the wire 23 is too long, the wire 23 becomes in the form of a helicoid and makes contact with other wires or a lead frame 22 (See FIG. 3B). In some cases, as shown in FIG. 3c, the wire 23 is slacked and placed into contact with the lead frame 22. Furthermore, as shown in FIG. 3D, the wire 23 is bent laterally and placed in to contact with the lead frame 22.

In order to overcome the above problems, there has been proposed a method for rotating a wire spool 19 so as to control the length $W_1$ of the wire 5. However, the adverse effects of the above described problems cannot be eliminated.

Furthermore, the conventional bonding methods and devices have the following problems: (1) that the inertia of a swinging part is large so that a high-power driving means is required; (2) that in order to form a loop of wire, the bonding tool must be vertically shifted by some distance or height so that it takes time to vertically move the bonding tool; and (3) that in order to cut off wire into a predetermined length, the bonding tool must be temporarily stopped while it is being lifted and then the wire clamp must be closed. As a result, the number of bonding operations per unit time is limited.

There is a following problem in the movement of the bonding tool 6 in the XY direction. That is, in order to move the bonding tool 6 in the XY direction the X-direction and Y-direction motors 1 and 2 must be energized. For instance, assume that, as shown in FIG. 4, the wire bonding tool 6 must be shifted from the origin O to a desired point P (a,b). Then the drive motors 1 and 2 are simultaneously energized and when the desired value b in the Y-direction is attained, the drive motor 2 is stopped. Thereafter when the desired value a in the X-direction is attained the drive motor 1 is stopped. As a result, the bonding tool 6 describes a locus $l_1$ as shown in FIG. 4. The locus $l_1$ is bent at a point Q (b,b). The locus $l_1$ causes the bonding tool 6 to change its course abruptly at the point Q (b,b). As a result, the bonding wire carried by the bonding tool 6 is bent to be in the form of an undesired loop form.

In order to solve the above described problem, when the movement distances in the X-direction and the Y-direction are different from each other, the velocity in the direction of a shorter distance is decreased so that the bonding tool 6 describes a locus $l_2$ as shown in FIG. 4. Therefore, the locus $l_2$ does not cause the bonding tool 6 to change its course abruptly. The time required for the bonding tool 6 to move from the origin O to the desired point P (a,b) is dependent upon the longer distance of a or b. It follows, therefore, that the time required to move the bonding tool 6 from the origin O to the desired point P (a,b) is equal to the time required to move the bonding tool 6 from the origin O to a point R (a,c). But the lengths of the loci $l_1$ and $l_2$ are different from each other so that the velocity of the bonding tool 6 at which the bonding tool 6 moves from the origin O to the desired point P (a,b) is different from the velocity of the bonding tool 6 at which the bonding tool 6 moves from the origin O to the point R (a,c). Meanwhile, in order to accomplish a reliable bonding operation, the velocity of the bonding tool is limited to a predetermined value. When the bonding tool 6 is controlled in the manner described above, in some cases the velocity of the bonding tool 6 exceeds the predetermined value, because the velocity of the bonding tool 6 is different according to the direction of shift of the bonding tool 6. When the velocity of the vertical movement of the bonding tool 6 remains constant, the loci of the bonding tool 6 in the three-dimensional space are different, as shown in FIG. 5, according to the velocity of the horizontal movement of the bonding tool 6. As a result, the shapes of loop of bonding wire are dependent upon the locus of the bonding tool 6. Therefore, the reliable wire bonding operation cannot be ensured.

FIG. 6 shows the conventional control of the drive motors 1 and 2. In this case, as shown in FIG. 6C, the uniformly accelerative control is employed. That is, in the case of acceleration, the motors 1 and 2 are accelerated at $\alpha_1$ and in the case of deceleration, the motors are decelerated at $-\alpha_1$. In the case of the uniformly accelerative control, the velocity v is linearly increased and decreased as shown in FIG. 6B. The relationship between the time t and the displacement S is shown in FIG. 6A. When the motors are controlled in the manner described above, the acceleration of the motors is abruptly changed so that strong impact is imparted to the bonding tool driven by the motors. Thus, the bonding tool is subjected to vibration or oscillation. The higher the velocity, the higher the impact becomes so that the stable and smooth wire bonding operation cannot be ensured.

In addition to the mechanism for causing the vertical movement of the bonding tool as shown in FIG. 1, there are various mechanisms. For instance, in the case of a wire bonding device as disclosed in Japanese Patent Application Laid-Open No. 55-74152, the relationship between the angle of rotation of a drive motor and the angle of rotation of a bonding arm carried by a bonding tool is expressed by a complex equation including a trigonometric function. That is, the relationship between the vertical shift of the bonding tool and the angle of rotation of the drive motor is complicated. Therefore there arises the problem that the control of the bonding tool by means of the angle of rotation of the drive motor is complicated.

In the case of a mechanism for vertically moving a bonding tool of the type as disclosed in Japanese Patent Application Laid-Open No. 54-154273, a bonding arm and a bonding arm supporrtng member are vertically moved in unison so that the weight of the driven parts is heavy and consequently a high power drive motor is needed. Furthermore, a screw is used to translate the rotation of the drive motor into the vertical movement of the bonding tool so that there arises the problems that the response of the vertical movement is low because the vertical shift in response to the rotation of the screw is small.

In the case of a wire bonding device of the type as disclosed in Japanese Patent Application Laid-Open No. 57-35330, a drive wire which is wound around the rotating axis of a drive motor is coupled to a bonding arm so that the rotation of the drive motor is translated into a rectilinear movement of the bonding arm. This wire bonding device has the problem that the vibration of the drive wire causes the bonding arm to vibrate. Furthermore, the drive wire must be always under tension so that the bonding arm can follow the rotation of a pulley. As a result, additional driving force is needed in order to impart tension to the drive wire so that a high power drive motor is required.

SUMMARY OF THE INVENTION

A first object of the present invention is to provide a wire bonding method and device which can prevent the faulty formation of loop of bonded wire and can shorten a wire bonding operation time, whereby productivity can be remarkably improved.

A second object of the present invention is to provide a wire bonding method and device which can accomplish wire bonding operation at a high speed in a stable manner.

A third object of the present invention is to provide a wire bonding device in which in proportion to the variations in angle of rotation of a drive motor, a bonding tool is shifted.

A fourth object of the present invention is to provide a wire bonding device which can be driven at a lower power and has a high degree of response.

A fifth object of the present invention is to provide a wire bonding devce in which vibration of a bonding arm can be reduced.

A sixth object of the present invention is to provide a wire bonding device which can reduce damages to semiconductor pellets in the case of wire bonding.

To achieve these objects, the present invention provides a wire bonding method comprising the steps of: forming a ball at the leading end of bonding wire; lowering a bonding tool so that said ball of said bonding wire is bonded at a first bonding position; closing a wire clamp to clamp said bonding wire, lowering said wire clamp, and moving said wire clamp closer relative to said bonding tool, thereby drawing said bonding wire by a predetermined length from said bonding tool, said predetermined length being determined according to the distance between the first bonding position and the second bonding position; lowering said bonding tool while moving said bonding tool to said second bonding position and opening said wire clamp so that said bonding wire is bonded to said second bonding position; and closing said wire clamp to clamp said bonding wire and lifting said wire clamp to pull said bonding wire and cutting said bonding wire at said second bonding position.

To achieve these objects, the present invention further provides a wire bonding device comprising a bonding tool for holding a bonding wire; a main arm having one end securely joined to said bonding tool and the other end constituting a first cam follower means; an auxiliary arm haviing one end securely joined to said main arm and the other end constituting a second cam follower means; cam means having such a cam curve that the displacement of said first cam means changes linearly relative to the variations in angle of rotation of a cam shaft and that the distance between said first and second cam means can be maintained constant; and driving means for rotating said cam means about the axis of said cam shaft.

To achieve these objects, the present invention further provides a wire bonding device comprising a bonding tool for holding a bonding wire at a position adjacent to its leading end, said bonding wire being supplied from a wire spool; first driving means for causing the vertical movement of said bonding tool; a wire clamp for clamping said bonding wire at position between said spool and said bonding tool; means for opening and closing said wire clamp; and second driving means for causing the vertical movement of said wire clamp independently of the vertical movement of said bonding tool.

The above and other objects, effects, features and advantages of the present invention will become more apparent from the description of preferred embodiments thereof taken in conjunction with the accompanying drawings.

DETAILED DESCRIPTION OF THE INVENTION

Figure 1:
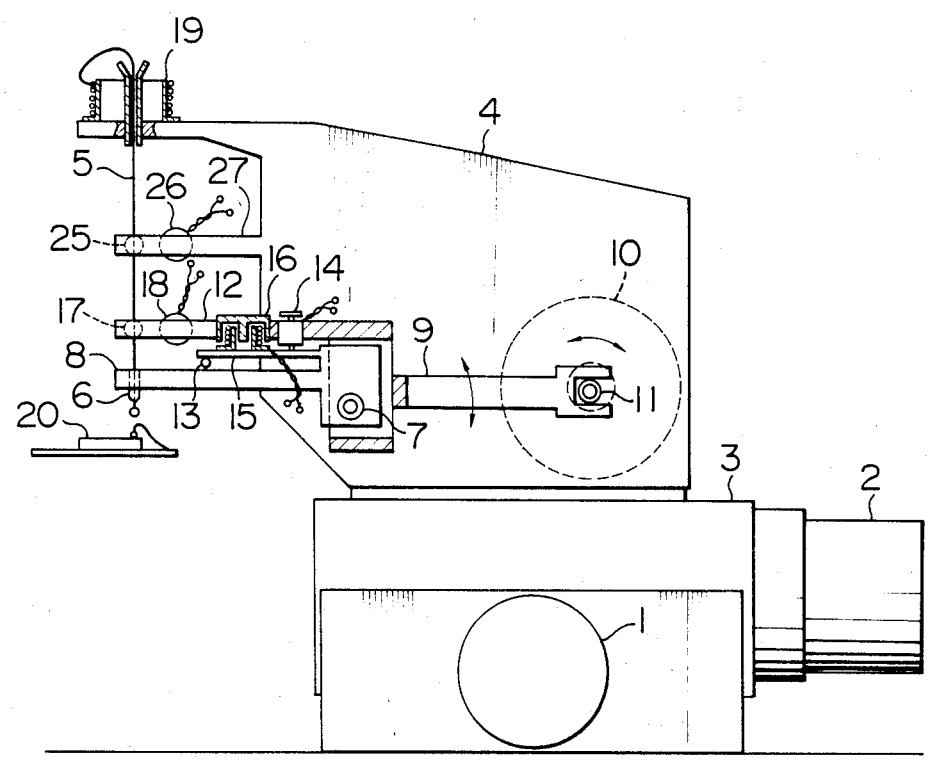
FIG. 1 is a side view of a conventional wire bonding device.
Figure 2A:
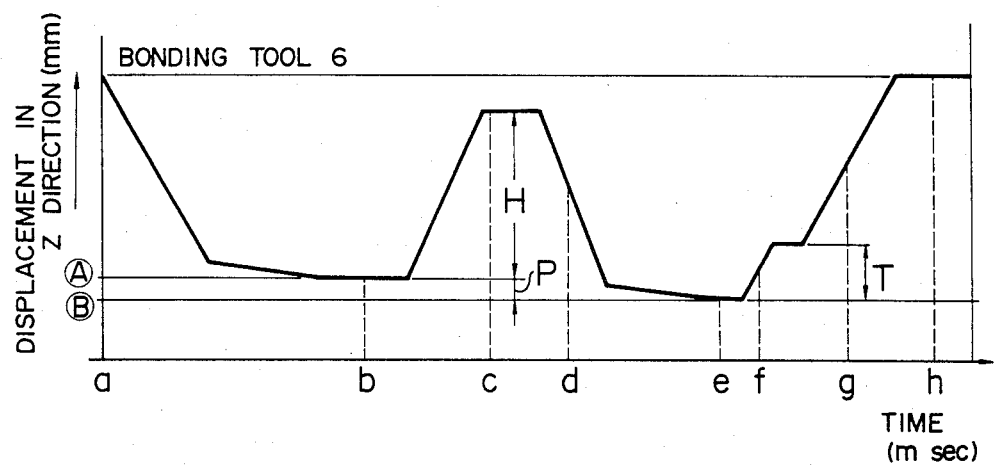
FIG. 2A illustrates displacement of a conventional device as a function of time.
Figure 2B:
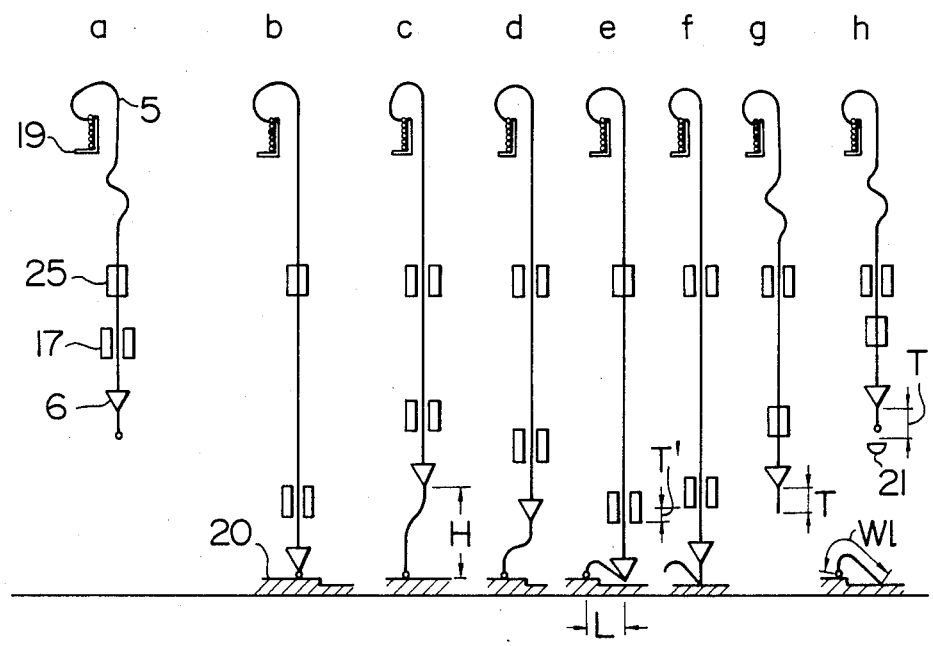
FIG. 2B illustrates the bonding operation in conjunction with FIG. 2A.
Figure 3A:
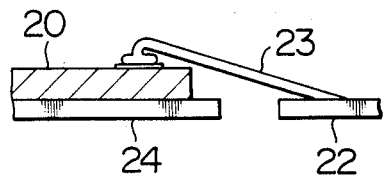
FIG. 3A shows a faulty configuration of wire loops caused by the wire bonding device as shown in FIG. 1.
Figure 3B:
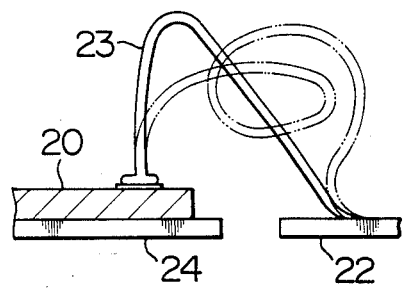
FIG. 3B shows a faulty configuration of wire loops caused by the wire bonding device as shown in FIG. 1.
Figure 3C:
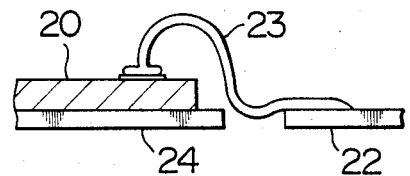
FIG. 3C shows a faulty configuration of wire loops caused by the wire bonding device as shown in FIG. 1.
Figure 3D:
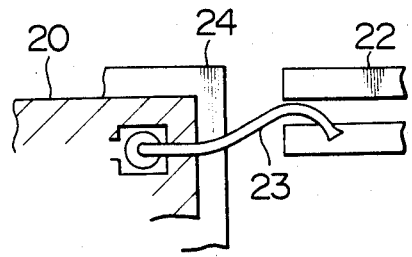
FIG. 3D shows a faulty configuration of wire loops caused by the wire bonding device as shown in FIG. 1.
Figure 4:
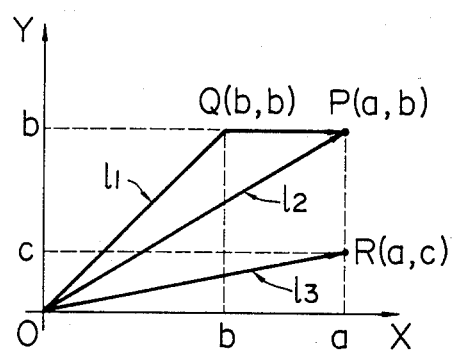
FIG. 4 illustrates the mode of operation of the bonding device as shown in FIG. 1.
Figure 6A:
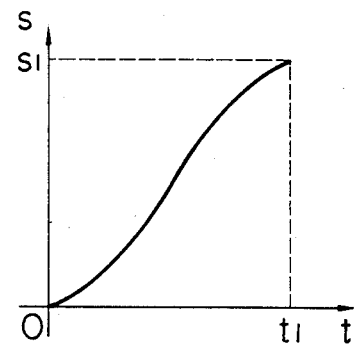
FIG. 6A illustrates the displacement of the drive motor with respect to time.
Figure 5:
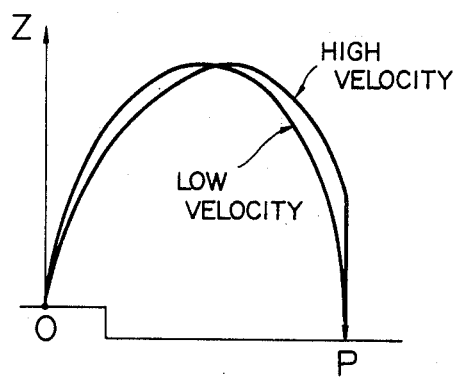
FIG. 5 illustrates the mode of operation of the bonding device as shown in FIG. 1.
Figure 6B:
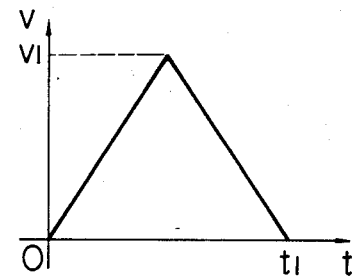
FIG. 6B illustrates the velocity of the drive motor with respect to time.
Figure 6C:
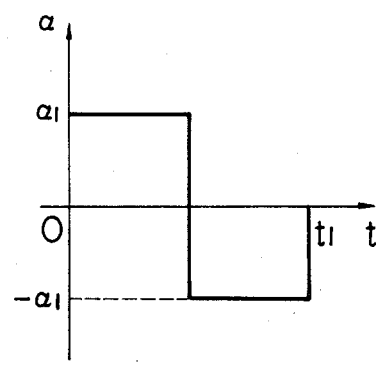
FIG. 6C illustrates the acceleration of the drive motor with respect to time.
Figure 7:
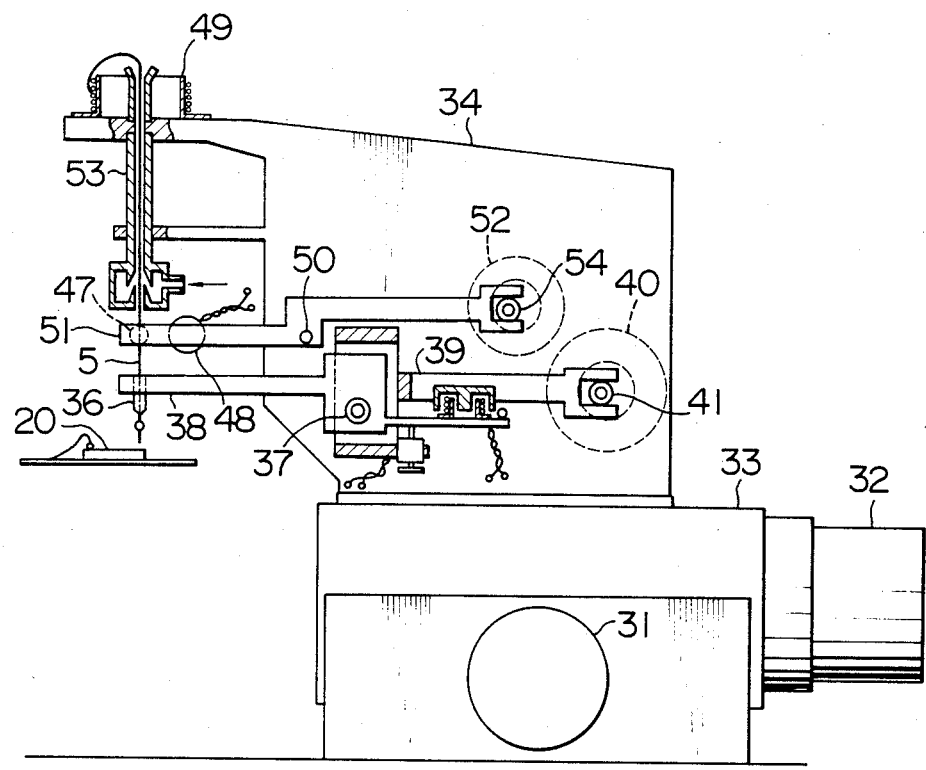
FIG. 7 is a side view of a wire bonding device according to a first embodiment of the present invention.

FIG. 7 shows a wire bonding device according to a first embodiment of the present invention. A bonding head unit 34 is mounted on an XY table 33 which is shifted in the X- and Y-directions by means of an X-direction drive motor 31 and a Y-direction drive motor 32. The bonding head unit 34 includes a bonding tool 36 through which is extended a bonding wire 5. The bonding wire 5 is extended beyond the leading end of the bonding tool 36. A ball is formed at the leading end of the bonding wire 5. The bonding tool 36 is carried by a bonding arm 38 which in turn pivots about a pivotal point 37. A swinging arm 39 is mounted on the pivotal point 37 so as to pivot or swing about the pivotal point 37. When the shaft of an eccentric pin 41 is rotated in the clockwise and counterclockwise directions by means of a Z-direction drive motor 40, the bonding tool 36 is caused to vertically move through the swinging arm 39 and the bonding arm 38. One or more sets of a wire clamp 47 and a solenoid 48 are mounted on a clamp arm 51 which in turn swings about a pivotal point 50 and is drivingly coupled to a Z-direction drive motor 52 so that the wire clamp 51 can vertically move. One of the features of the first embodiment of the present invention resides in the fact that the drive motors 40 and 52 are energized and de-energized independently of each other. The drive motors 40 and 52 are provided with rotary encoders. A glass tube 53 is disposed above the wire clamp 47 and a gas is forced to flow upwardly through the glass tube 53. The bonding wire 5 unrolled from a spool 49 is extended through the glass tube 53 and the wire clamp 51 to the bonding tool 36. As a result, the bonding wire 5 is forced upwardly toward the spool 51 under a predetermined force.

Figure 8A:
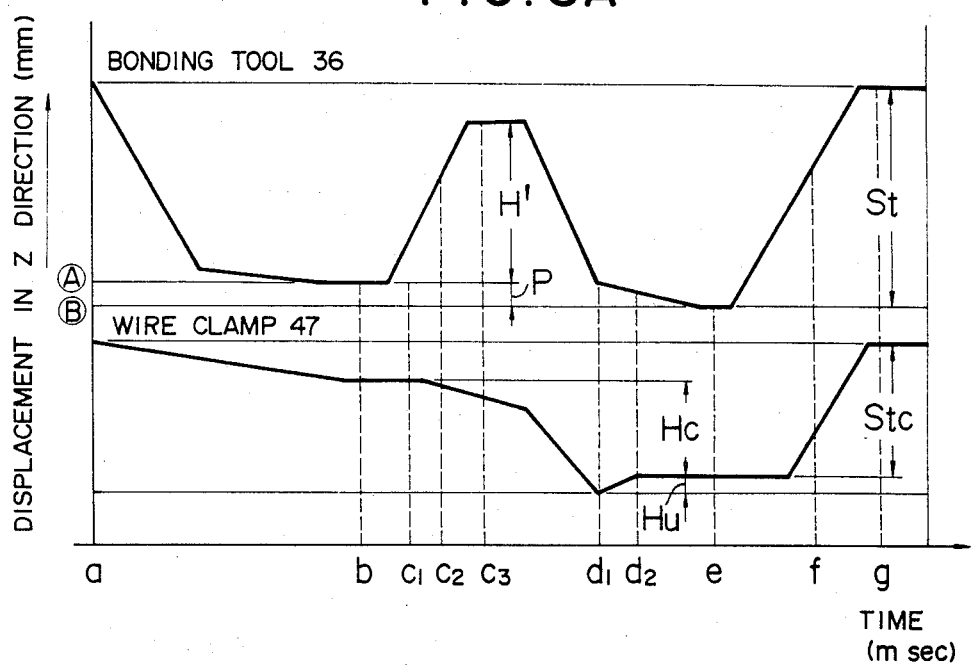
FIG. 8A illustrates the displacement of the bonding tool and the wire clamp with respect to time.
Figure 8B:
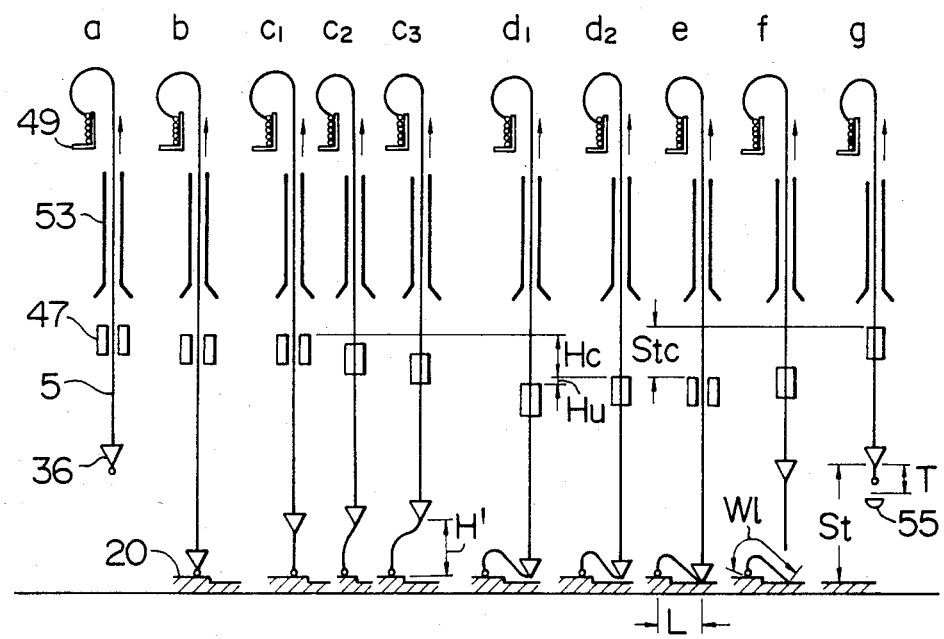
FIG. 8B illustrate the bonding operation in conjunction with the graph of FIG. 8A.
Figure 9:
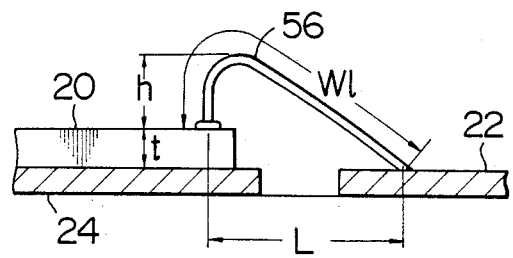
FIG. 9 illustrates the relationship between the length of the bonding wire and the distance between bonding positions.

Referring further to FIGS. 8A and 8B, the mode of operation of the wire bonding device with the above-mentioned construction will be described. A ball is formed at the leading end of the bonding wire 39 extended from the bonding tool 36. Since the bonding wire 5 is being pulled upwardly by the gas flowing upwardly in the glass tube 53, this ball is clinched to the leading end of the bonding tool 36 (time: a). Thereafter, while the wire clamp 47 is opened, only the bonding tool 36 is lowered so that the ball is bonded at a first bonding position (time: b). Thereafter the bonding tool 36 is slightly lifted (time: $c_1$) and the wire clamp 47 is closed whereby the bonding wire is clamped (time: $c_2$). While the wire clamp 47 is clamping the bonding wire 5, it is lowered so that the bonding wire 5 is unrolled from the spool 49. In this case, the bonding tool 36 is lifted (time: $c_3$). The wire clamp 47 supplies the Hc+Hu long bonding wire 5 to the bonding tool 36 (time: $d_1$). In this case, the length Hc is selected equal to the final bonding wire length $W_1$. The length $W_1$, which is shown in FIG. 9, is determined from the following equation obtained from experiences, based on the distance L between the first and second bonding positions and the height h of wire loop.

$$W_1 = K(h) \times L + C(h)$$

Figure 10:
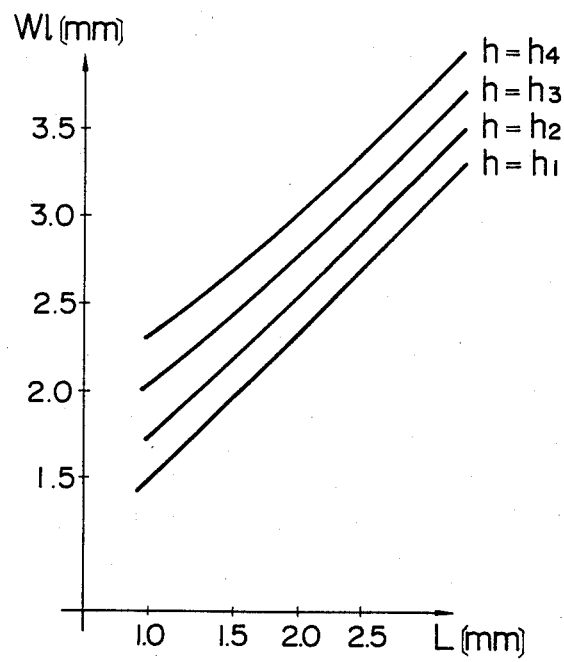
FIG. 10 graphically depicts the relationship shown in FIG. 9.

That is, when the distance L and the height h are determined, the length $W_1$ of the wire 5 can be obtained from the graph as shown in FIG. 10. When the length $W_1$ is once determined, the vertical shift H' of the bonding tool 36 is obtained by the following equation obtained from experiences:

$$H' = (0.2 - 1.2) \times W_1 + \alpha$$

Figure 11:
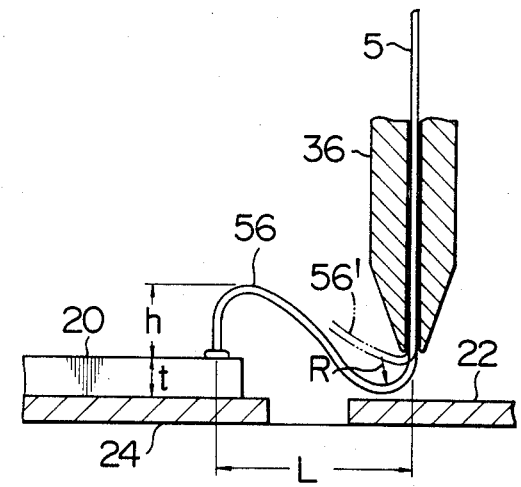
FIG. 11 illustrates a mode of operation of the device.

From the time b to the time $d_2$, the bonding tool 36 is shifted to the second bonding position. Prior to bonding at the second bonding position, the wire clamp 47 is shifted upward by Hu while clamping the bonding wire 5 so that the bonding wire 5 is slightly pulled (time: $d_2$). Then, as shown in FIG. 11, the wire loop 56 is pulled and shaped as indicated by the reference numeral 56' along the configuration of the leading end portion of the bonding tool 36. In the conventional wire bonding methods and devices, the wire loop 56 is not shaped as indicated by 56' and bonded at the second bonding position. As a result, the bonding wire which is spaced apart from the leading end of the bonding tool 36 is bonded to an external terminal 22 so that faulty shapes of the bonding wire occur as shown in FIG. 3. The upward shift Hu of the wire clamp 36 is determined based on the distance L between the first and second bonding positions, the height h of the wire loop 52, the thickness t of the semiconductor pellet 20, the strength of the bonding wire 5 and so on.

Next the wire clamp 47 is opened and the bonding tool 36 is further lowered so that the bonding wire 5 is bonded at the second bonding position (time: e). After bonding, first the bonding tool 36 is lifted. In this case, the wire clamp 47 is closed. After the bonding tool 36 has been lifted by a predetermined distance, the wire clamp 47 is lifted (time: f) and stopped (time: g) with the bonding wire 5 extended by T from the bonding tool 36 (See FIG. 8B). This length T can be obtained by making the upward shift St of the bonding tool 36 greater by T than the upward shift Sc of the wire clamp 47. Thereafter, a ball is formed at the leading end of the bonding wire 5 by means of a torch 55 (See FIG. 8B). Thus, the next bonding operation is ready.

As described before, the length $W_1$ of the wire can be obtained based on the distance L. Once the length $W_1$ is determined, the vertical shifts H', P and St and the velocity of the bonding tool 36 as well as the vertical shifts Hc, Hv and Stc and the velocity of the wire clamp 47 can be determined. The time when the XY table 33 is started, the time when the XY table 33 is stopped and the velocity of the XY table 33 are also determined from the length $W_1$; that is, the distance L.

As described above, according to the first embodiment of the present invention, the length $W_1$ of the wire loop 56 and the length T of the bonding wire extended from the bonding tool 36 can be correctly controlled by controlling the vertical movements of the bonding arm 38 and the clamp arm 51 independently of each other. Furthermore, the configuration of the wire loop can be suitably adjusted.

In the first embodiment, the arm is caused to swing by the drive motor which is coupled to the encoder; the clamp comprises the solenoid; and the linear motor is used to press the bonding tool on the bonding positions, but it is to be understood that any other suitable driving means and driving force transmission means may be employed. For instance, the bonding tool and the wire clamp can be reciprocated directly by means of linear motors. Furthermore, instead of the glass tube 49, a roller and a spring may be used to impart a predetermined tension to the bonding wire. Alternatively, air is blown laterally to the bonding wire 5 so that the bonding wire 5 can be maintained under a constant tension.

Furthermore, in addition to the wire clamp 47, another wire clamp may be disposed on the side of the spool and caused to swing in unison with the wire clamp 47 so that a surplus length of the bonding wire may be slacked between the two wire clamps. In this way, the slacking of the bonding wire can be prevented between the lower wire clamp and the bonding tool.

Moreover, according to the present invention, in response to the vertical movement of the wire clamp, the length of the bonding wire to be supplied to the bonding tool is determined and is not affected by the resistance encountered when the bonding wire is unreeled from the spool. Therefore, the spool can be disposed at a position different from that of the bonding head unit. As a result, the load on the XY table can be remarkably decreased and a spool with a large diameter can be used so that the wire bonding operation may be carried out for a long period of time.

Figure 12A:
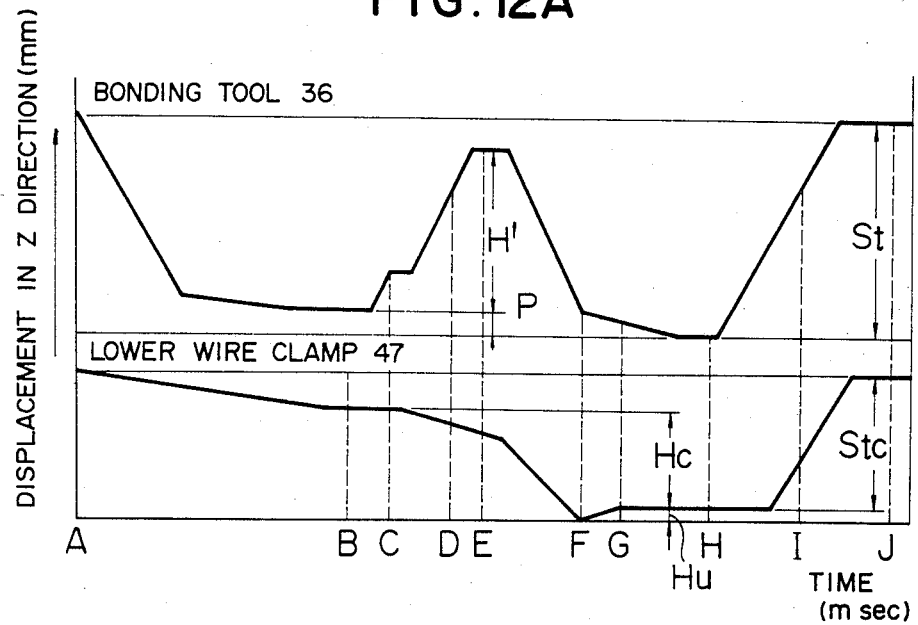
FIG. 12A discloses the displacement of the bonding tool on the lower wire clamp with respect to time of a second embodiment of the present invention.
Figure 12B:
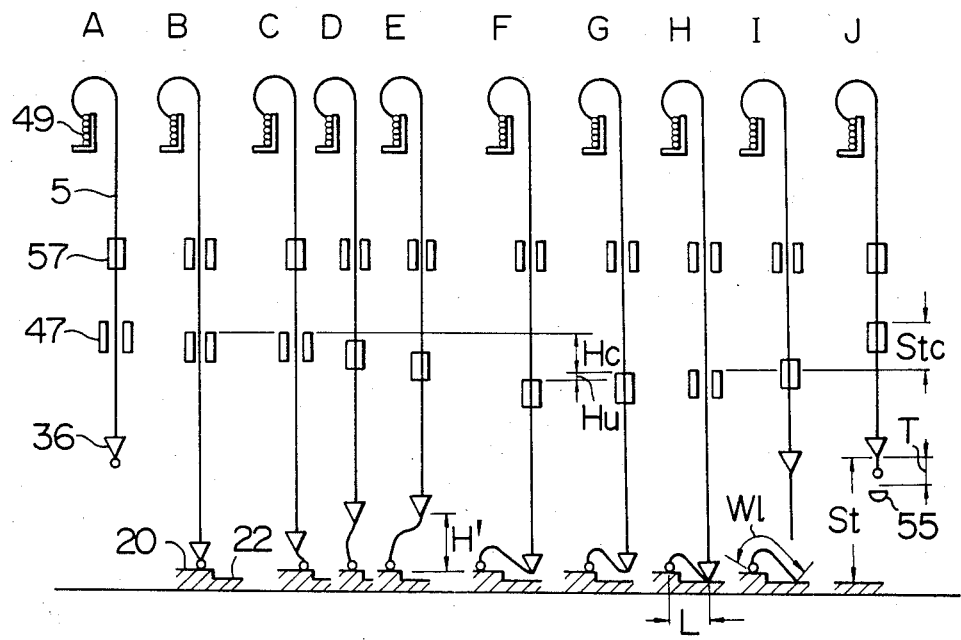
FIG. 12B illustrates the bonding operation in conjunction with the graph of FIG. 12A.

Referring next to FIGS. 12A and 12B, the second embodiment of the present invention will be described. In addition to the wire clamp 47, an additional wire clamp 57 is provided. The wire clamps 47 and 57 are referred to as "the lower wire clamp" and "the upper wire clamp", respectively. The bonding wire 5 unrolled or unwound from the spool 49 is inserted into the upper clamp 57 and the lower clamp 47 in the order named and is extended from the leading end of the bonding tool 36. Thereafter a ball is formed at the leading end of the bonding wire 5 by means of a torch (time: A). Next while both the lower and upper clamps 47 and 57 remain opened, the bonding tool 36 alone is lowered so that the ball is bonded at the first bonding position of the semiconducor pellet 20 (time: B). Thereafter the bonding tool is slightly lifted and then stopped while the upper clamp 57 is closed. The bonding tool 36 is moved away from the second bonding position (time: C). The second bonding position is located over the top surface of the external terminal disposed adjacent to the semiconductor pellet. The movement of the bonding tool 36 away from the second bonding position may be effected by shifting the XY table or stage (not shown) upon which the semiconductor pellet 20 is placed. Alternatively, the XY table upon which the bonding tool 36 is mounted may be shifted. As a result of this operation, the bonding wire is bent. Next the bonding tool 36 is slightly lifted while the lower clamp 47 is closed (time: D). The lower clamp 47 is lowered by a predetermined distance while the wire clamp 47 is closed so that the required length Hc of the bonding wire 5 is unreeled from the spool 49. In synchronism with the drawing of the bonding wire 5, the bonding tool 36 is lifted by a predetermined height H' (time: E). Next the bonding tool 36 is shifted to the position immediately above the second bonding position (time: F). This operation is effected by the displacement of the bonding tool 36 or the XY stage upon which the semiconductor pellet 20 is mounted. When the bonding tool 36 is brought to the position immediately above the second bonding position, the bonding wire 5 Hc in a length required for bridging and the excess bonding wire of the length Hu due to the previous lowering of the lower clamp 47 are supplied between the bonding tool 36 and the first bonding position. The length Hc of the bonding wire 5 which is required for bridging is determined by the above-described equation based on the distance L between the first and second bonding positions and the thickness of the semiconductor pellet 20. Next the upper clamp 47 is lifted so as to lift the bonding wire 5 by the excess length Hu (time: G). Thereafter, while the upper clamp 47 is opened, the bonding tool 36 is lowered to the second bonding position and the bonding wire 5 is bonded while it is being pulled (time: H). When the bonding operation begins, the lower clamp 47 is temporarily opened and closed again. Next while the lower clamp 47 is closed, the bonding tool 36 is lifted to a predetermined position and then the lower clamp 47 is lifted so that the bonding wire 5 is extended from the bonding tool 36 so as to form a next ball (time: I). The length T of the extension of the bonding wire 5 is determined by making the upward shift St of the bonding tool 36 longer than the upward shaft Stc of the lower clamp 47. Thereafter, a ball is formed at the leading end of the bonding wire 5 extended from the bonding tool 36 by means of a torch 55.

Figure 13:
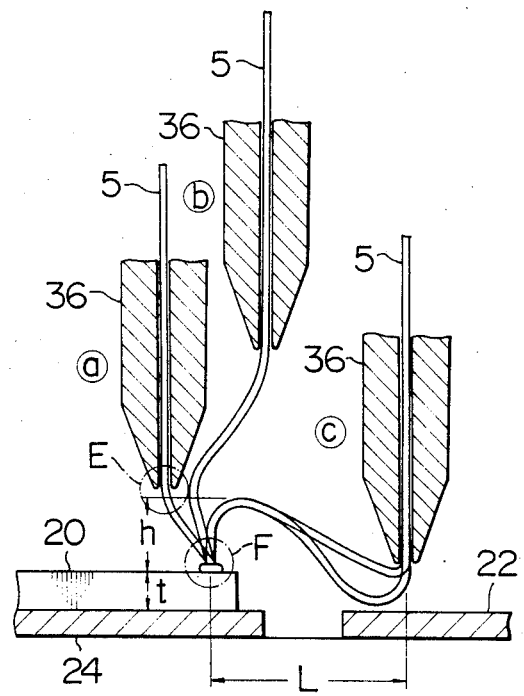
FIG. 13 is a sectional view of a second embodiment of the invention.

According to the above-described wire bonding method, as shown in FIG. 13, after the bonding wire has been bonded to the first bonding position, the bonding tool 36 is once moved away from the second bonding position as indicated by ⓐ and then brought to the second bonding position as indicated by ⓑ and ⓒ. As a result, the tendency is imparted to the bonding wire 5 in such a way that the bonding wire 5 is bent into a desired form. That is, the bonding wire 5 tends to bend at a point E adjacent to the lower leading end of the bonding tool 36. The bent portion E becomes an apex of the bonding wire 56 bridging between the first and second bonding positions. Furthermore, the bonding wire 5 tends to bend at F adjacent to the second bonding position. Because of these tendency of the bonding wire 5 to bend in the manner described above, the bridged bonding wire 5 forms a loop with the portion adjacent to the second bonding position being upright.

As a consequence, the contact of the bonding wire 5 with the semiconductor pellet 20 and the external terminal 22 can be prevented and the bridged bonding wires always assume the similar loop.

Furthermore, the length $W_1$ of the bridging bonding wire 5 and the length T of the bonding wire 5 extended from the bonding tool 36 in order to form a ball at the leading end of the bonding wire 5 are determined by shifting the lower clamp 47 so as to directly unreeling the bonding wire 5 from the spool. As a consequence, these lengths can be determined with a high degree of accuracy.

As a result, the bonding length of the loop configuration can be accurately controlled so that faulty configurations of bonding wire can be prevented and consequently the yield as well as productivity can be remarkably improved.

The shift of the bonding tool to the second bonding position may be effected in such a way that when the bonding tool 36 reaches the upper dead point, it is guided toward the second bonding position while being lowered. Furthermore, the bonding tool 36 is once moved away from the second bonding position so that the bonding wire 5 has the bending tendency as described above. Thereafter, the upper clamp 57 may be opened and the bonding tool 36 may be moved toward the second bonding position.

As described above, according to the wire bonding method described above, the length of the bonding wire and the loop configuration thereof can be correctly controlled so that faulty configurations of the bonded wires can be avoided so that the yield as well as productivity can be considerably improved.

As described above, according to the present invention, the length of the bonding wire loop can be correctly controlled so that faulty configurations of bonding wire loops can be avoided and consequnetly the yield can be improved. Furthermore, latent faulty parts which cannot be rejected by electric tests can be eliminated so that the conventional outer appearance test and sampling inspections may be eliminated. As a result, productivity can be improved.

Moreover, according to the present invention, the bonding wire is always forced upwardly slightly so that faulty parts due to the slacking of bonding wire can be eliminated.

Furthermore, according to the present invention, the bonding tool and the wire clamps can be driven independently of each other so that they can be vertically moved in a very efficient manner. Moreover, unlike the conventional wire bonding methods and devices, the vertical movement is not needed to be stopped in order to clamp the bonding wire so that the bonding time can be shortened and consequently the productivity can be improved.

Figure 14:
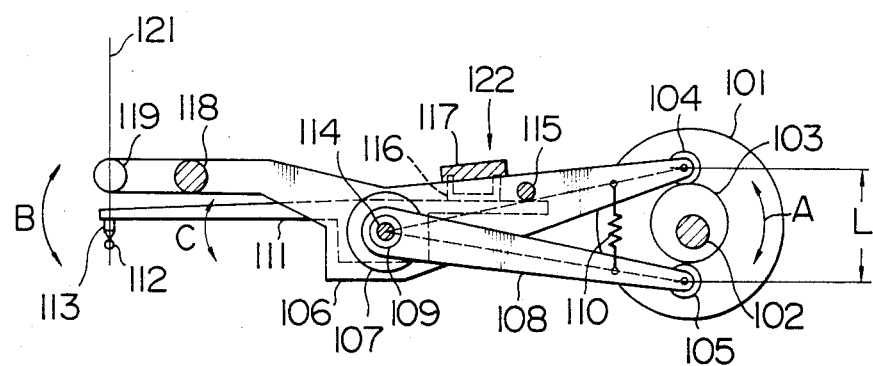
FIG. 14 is a side view of a wire bonding device according to a third embodiment of the present invention.

Referring next to FIG. 14, a wire bonding device according to a third embodiment of the present invention will be described. The third embodiment relates to an improvement of means for driving a bonding arm.

A drive motor 101 is used to cause the vertical movement of a bonding tool 113 and the shaft 102 of the drive motor 101 carries an encoder (not shown) and a cam 103. The bonding tool 113 is attached to one end of a bonding arm 111 which in turn is swingably attached to a pivot pin 109. A swinging arm 106 is also swingably attached to the pivot pin 109. The swinging arm 106 carries a cam follower 104 which is normally made into contact with the cam 103. One end of an auxiliary arm 106 is swingably attached to the pivot pin 109 while the other end thereof carries a cam follower 105 made into contact with the cam 103. That is, the cam 103 is sandwiched by the cam followers 104 and 105. A spring 110 is loaded between the swinging arm 106 and the auxiliary arm 108 so that the cam followers 104 and 105 are forcibly made into contact with the cam 103. Furthermore, because of the bias spring 110, there exists no play between the cam 103 on the one hand and the cam followers 104 and 105 on the other hand. The force exerted by the spring 110 to the cam follower 104 is equal to and opposite to the force exerted by the spring 110 to the cam follower 105 so that these forces are cancelled by each other. Therefore, even when the force of the spring 110 is exerted to the cam followers 104 and 105 which are made into contact with the cam 103 carried by the shaft 102 of the drive motor 101, the driving torque of the drive motor 101 is not increased.

The pivot pin 109 to which are pivotably attached the swinging arm 106 and the auxiliary arm 108 is supported by a bearing 107. The swinging arm 106 also carries a wire clamp 119 for clamping a bonding wire 121 and a solenoid 118 for driving the wire clamp 119.

The bonding arm 111 is connected through a connecting pin 114 to the swinging arm 106 and carries a linear motor 122 comprising a magnet 117 and a moving coil 116. The linear motor 122 serves to prevent the inertia of the swinging arm 106 from directly being transmitted to the bonding arm 111 so that a semiconductor pellet (not shown) is prevented from being damaged by a ball 112 which is formed at the instant of bonding the bonding wire 121. When the bonding tool 113 is displaced at a high speed, it is held with a strong force, but in the case of bonding, it is maintained by a force corresponding to the bonding pressure by controlling the current flowing through the linear motor 122. An optimum holding force varies with the change in bonding conditions, but it can be attained by controlling the magnitude of current. In order to hold the bonding arm 111, in addition to the linear motor 122, a spring may be used. When the spring is used, the load on the linear motor 122 can be decreased and therefore can be made in compact in size and light in weight.

Figure 15:
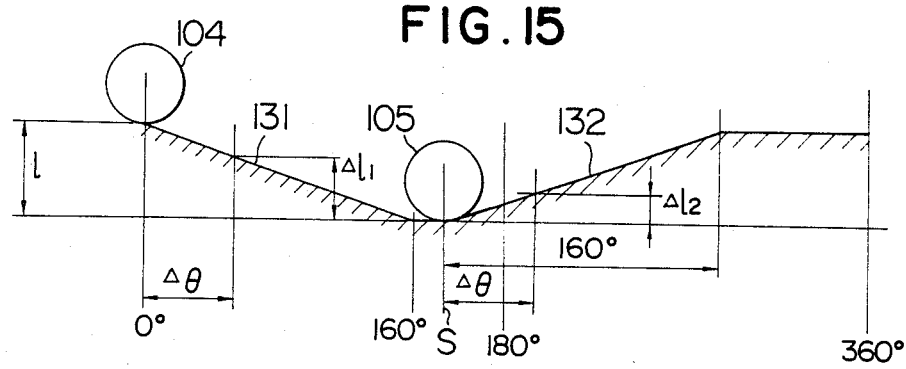
FIG. 15 shows a cam chart of cam used in the wire bonding device as shown in FIG. 14.

FIG. 15 shows a cam chart of the cam 103 consisting of two constant velocity curves 131 and 132. The angle of action of the cam is 160°. The constant velocity cam curve 131 shows the displacement of the cam follower 104 while the constant velocity cam curve 132 shows the displacement of the cam follower 105. The positional relationship between the cam followers 104 and 105 is so determined that regardless of the angular position of the cam 103 within the angle of action, the sum of the cam lifts of the cam followers 104 and 105 can be maintained constant. When the cam follower rotates through an angle $\Delta\theta$, the sum of a cam lift $\Delta l_1$ and a cam lift $\Delta l_2$ of the cam followers 104 and 105 is always a constant value l. The swinging arm 106 which carries the cam follower 104 and the auxiliary arm 108 which carries the cam follower 105 are pivotably attached to the same pivot pin 109 and the distance between the pivot pin 109 and the cam follower 104 is equal to the distance between the pivot pin 109 and the cam follower 105 so that the distance L between the axes of the cam followers 104 and 105 always remains constant. Furthermore, when the position of the cam follower 105 is adjusted, a play can be reduced to a minimum. Even when the position of the cam follower 105 is adjusted, torque of the cam shaft will not be increased.

The cam lift is determined as follows. In the third embodiment the angle of action is 160° as described above. Assume that the encoder is of 4000/one revolution and its resolution is 4μ/pulse. Then the stroke of the bonding tool 113 becomes:

$$4000 \times \frac{160°}{360°} \times 4\mu = 7110\mu.$$

Therefore, the cam lift is so determined based on the lever ratio of each arm that the stroke of the bonding tool 113 becomes 7.11 mm.

When the drive motor 101 is rotated in the directions indicated by the double-pointed arrow A, the bonding arm 111 is rotated in the directions indicated by the double-pointed arrow C through the cam 103, the cam follower 104 and the swinging arm 106 and consequently the bonding tool 113 is rotated in the directions indicated by the double-pointed arrow B. In this case, the displacement or stroke of the bonding tool 113 is in proportion to the angle of rotation of the drive motor 101.

Figure 16:
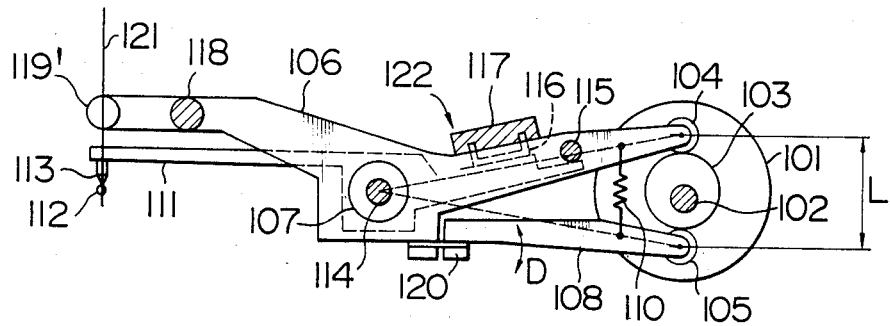
FIG. 16 shows a modification of the wire bonding device according to the third embodiment as shown in FIG. 14.

FIG. 16 shows a modification of the third embodiment of the present invention. This modification is different from the third embodiment described above with reference to FIGS. 14 and 15 in that the auxiliary arm 108 is connected to the swinging arm 106 through a leaf spring 120 so that a play can be eliminated and the construction of the supporting or pivot pin of the auxiliary arm 108 can be simplified.

In the third embodiment, the angle of action of the cam is 160°, but it can be varied arbitrarily depending upon the stroke of the bonding tool 113, the lengths of the arms and the diameter of the cam. Furthermore, the cam of the swinging arm may be disposed independently of the cam carried by the auxiliary arm so that the angle of action may be effectively increased beyond 180°.

Moreover, the bonding arm and the swinging arm can be combined into a single main arm. In this case, the voice coil motor can be eliminated and the construction can be simplified.

Figure 17:
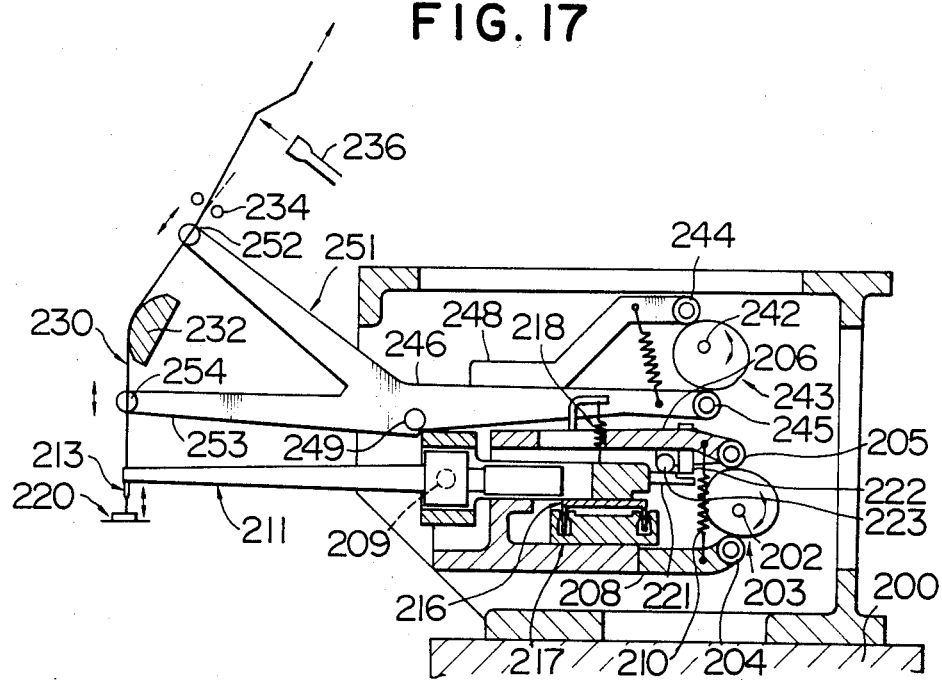
FIG. 17 is a side view of a wire bonding device according to a fourth embodiment of the present invention.

Referring next to FIG. 17, a wire bonding device according to a fourth embodiment of the present invention will be described. In the fourth embodiment, a bonding arm carrying a bonding tool can be driven independently of a clamp arm carrying a plurality of wire clamps and a driving mechanism is modified as in the case of the third embodiment described with reference to FIG. 14.

The drive shaft 202 of a motor (not shown) for driving a bonding tool 213 carries a rotary encoder (not shown) and a cam 203. A bonding arm 211 and a swinging arm 206 are swingably attached to the same pivot pin 209. The swinging arm 206 carries a cam follower 205 which is made into contact with the cam 203. An auxiliary arm 208 is extended from the swinging arm 206 and carries a cam follower 204 made into contact with the cam 203. Therefore, the cam 203 is sandwiched by the cam followers 204 and 205. A spring 210 is loaded between the swinging arm 206 and the auxiliary arm 208 so that the cam followers 204 and 205 are normally pressed against the cam 203 under a predetermined force of the spring 210.

A bonding arm 211 is connected through the pivot pin 209 to the swinging arm 206 and is held by a linear motor consisting of a magnet 217 and a moving coil 216 and a spring 218. A stop pin 223 for limiting the rotation of the bonding arm 211 is disposed adjacent to an end 221 of the bonding arm 211. In order to detect the movement of the end 221 of the bonding arm 211, a capacitor sensor 222 is provided. When the bonding tool 213 is made into contact with a bonding position, the bonding arm 211 is slightly rotated so that the gap or distance between the capacitor sensor 222 and the end 221 of the bonding arm 211 varies. In response to the output from the capacitor sensor 222, the moment when the bonding tool 213 is made into contact with the bonding position can be detected and the ultrasonic bonding operation is started from the moment.

The drive shaft 242 of a motor (not shown) used to cause the vertical movement of an upper clamp 252 and a lower clamp 254 carries a rotary encoder (not shown) and a cam 243. A clamp arm 246 is adapted to rotate about a pivot pin 249. One end of the clamp arm 246 is bifurcated into arms 251 and 253 while the other end of the clamp arm 246 carries a cam follower 245 made into contact with the cam 243. An auxiliary arm 248 is extended from the clamp arm 246 and a cam follower 244 is carried by the free end of the auxiliary arm 248. Therefore the cam 243 is sandwiched by the cam followers 244 and 245. A spring 250 is loaded between the clamp arm 246 and the auxiliary arm 248 so that a predetermined magnitude of force is normally exerted to the cam followers 244 and 245.

The bonding wire 230, which is unreeled from a spool (not shown), passes through the upper and lower clamps 252 and 254 and is extended beyond the lower end of the bonding tool 213. A bonding wire guide 232 is interposed between the upper and lower clamps 253 and 254. A guide 234 is also disposed immediately above the upper clamp 252. In order to impart tension to the bonding wire 230 so that the bonding wire 230 may be always pulled upwardly, the air ejected from an air nozzle 236 is blown against the bonding wire 230.

Figure 18A:
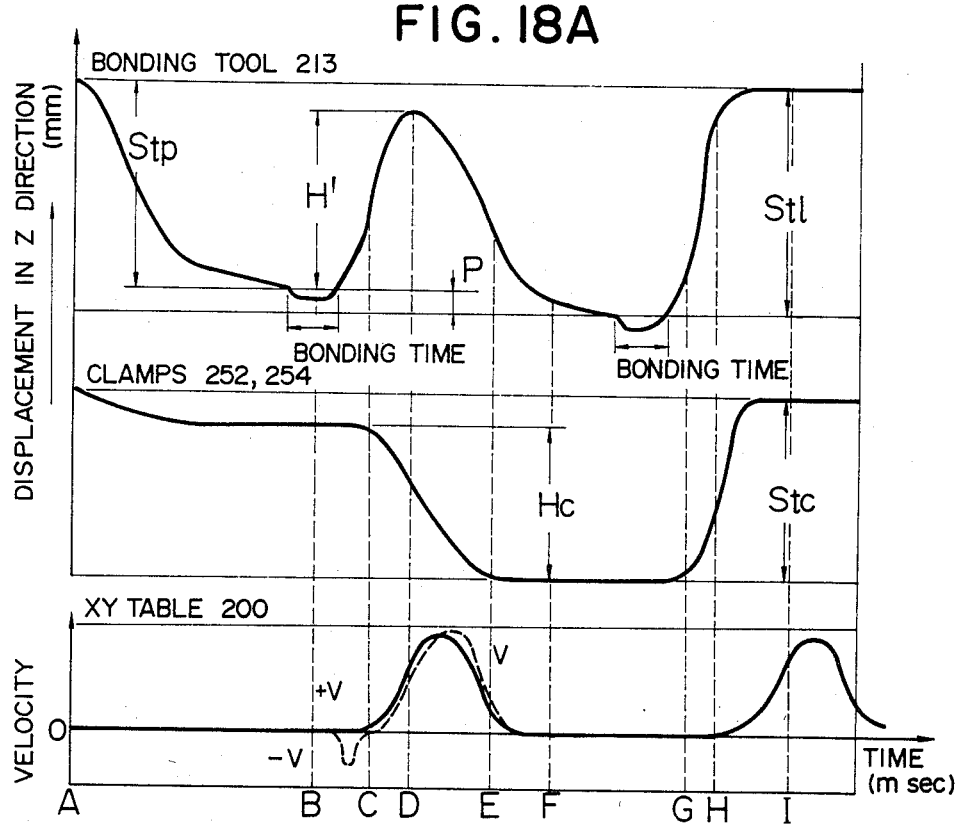
FIG. 18A illustrates the displacement of the bonding tool and clamps with respect to time, as well as the velocity of the XY table with respect to time.
Figure 18B:
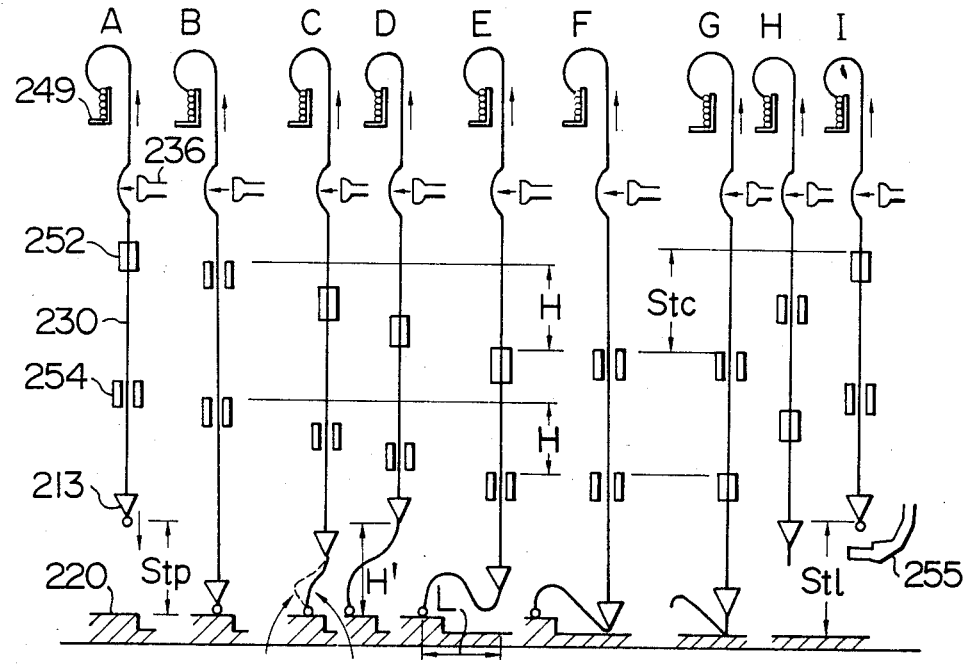
FIG. 18B illustrates the bonding operation in conjunction with the graph of FIG. 18A.
Figure 19A:
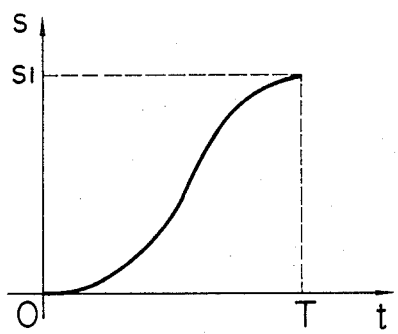
FIG. 19A illustrates displacement of the bonding tool with respect to time.
Figure 19B:
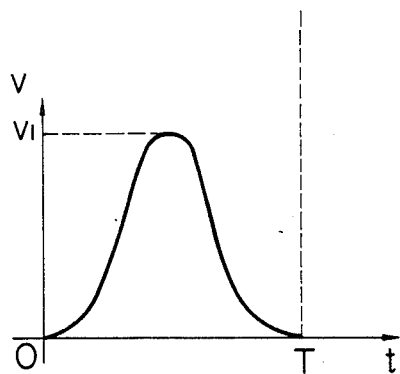
FIG. 19B illustrates the velocity of the motor with respect to time.
Figure 19C:
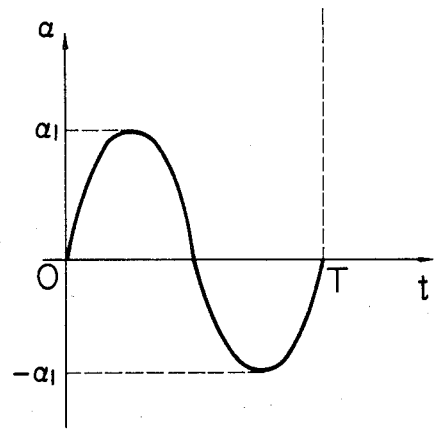
FIG. 19C illustrates the acceleration of the motor with respect to time.

Referring next to FIGS. 18A and 18B, the mode of operation of the fourth embodiment will be described. One of the features of the fourth embodiment of a wire bonding device in accordance with the present invention resides in the fact that the motor for causing the vertical movement of the bonding tool 213, the motor for causing the vertical movement of the clamps 252 and 254 and a motor used for shifting an XY table are controlled as shown in FIG. 19. More particularly, as shown in FIG. 19C, the acceleration α of each motor is in the form of a sinusoidal waveform. Since abrupt changes in acceleration can be prevented, the load applied to the motor is less and impacts or shocks are also less. The velocity v is also of a sinusoidal waveform as shown in FIG. 19B. The displacement S is represented by a cycloidal curve. Therefore, the displacement is given by:

$$S = S_1 \times \left( \frac{t}{T} - \frac{1}{2\pi} \sin 2\pi \frac{t}{T} \right)$$

wherein:

$S_1$ is the total displacement; and

T is a time required for attaining the total displacement.

Any other suitable control system may be employed as far as abrupt changes in acceleration α will not occur. For instance, a motor control system is employed so that the displacement-time curve is a simple harmonic curve or a trapezoidal curve.

The time T is determined, upon substitution of the distance L between the first and the second bonding positions for the total displacement $S_1$ in the above equation, and in accordance with the critical (maximum) velocity of the XY table 33. The velocity of the XY table 33 and the lifting and lowering velocities of the bonding tool 36 and the wire clamps 47 and 57 are determined according to the time T. Through control of the drive of the XY table 33, the bonding tool 36 and the wire clamps 47 and 57, desired loci of movement thereof are attained.

In the fourth embodiment, the angles of rotation of motors are in proportion to the vertical shifts of the bonding tool and the clamps so that the above-described complicated control can be easily accomplished.

The wire bonding method as shown in FIGS. 18A and 18B is substantially similar to that as shown in FIGS. 12A and 12B except that the displacement describes a cycloidal curve and that the upper and lower wire clamps are moved vertically in unison. More specifically, first the leading end of the bonding tool 213 clinches a ball at the leading end of the bonding wire 230 by closing the upper clamp 252 and lowering the bonding tool 213 (time: A). Next while the upper and lower clamps 252 and 254 remain opened, only the bonding tool 213 is lowered so that the ball is bonded by an ultrasonic welding process during a predetermined time at the first bonding position of a semiconductor pellet 220 (time: B). Thereafter, the bonding tool 213 is slightly lifted and then the upper clamp 254 is closed. And the bonding tool 213 is once moved away from the second bonding position and then moved toward the second bonding position (time: C). The second bonding position is located at the upper surface of an external terminal disposed adjacent to the semiconductor pellet 220. The operation for moving the bonding tool 213 away from the second bonding position is accomplished by shifting the XY table 200 upon which is mounted the bonding tool 213 as shown in FIG. 18A.

Thereafter while the upper clamp 252 is closed, it is lowered by a predetermined distance so that the bonding wire 230 of the length Hc required for bridging between the first and second bonding positions is unreeled from the spool 249. In synchronism with the unreeling of the bonding wire 230, the bonding tool 213 is lifted to a predetermined height H′ (time: D). Next the bonding tool 213 is brought to the position immediately above the second bonding position (time: E). In this case, the drive is so controlled that a sinusoidal velocity curve may be described as shown in FIG. 18A. When the bonding tool 213 is brought to the position immediately above the second bonding position, the bonding wire 130 of the length Hc required for bridging between the first and second bonding positions is supplied between the bonding tool 213 and the first bonding position.

Thereafter the upper clamp 252 and the lower clamp 254 are opened and the bonding tool 213 is further lowered to the second bonding position so that the bonding wire 230 is connected to or bonded at the second bonding position in such a way that the bonding wire 230 remains in a pulled state (time: F). Next while the lower clamp 254 is opened, the bonding tool 213 is lifted to a predetermined position (time: G). Thereafter the upper and lower clamps 252 and 254 are lifted so that a predetermined length of bonding wire 230 is extended from the bonding tool 213 in order to form a next ball (time: H). Next a ball is formed by means of a torch 255 at the leading end of the bonding wire 230 extended from the bonding tool 213 (time: I).

As described above, according to the present invention, the bonding tool can be shifted in proportion to the angle of rotation of the drive motor. Therefore, the displacement of the bonding tool can be directly controlled in response to the angle of rotation of the drive motor; that is, an accurate control is possible. Therefore, the wire bonding device in accordance with the present invention is adapted to be controlled digitally. If the displacement of the bonding tool can be correctly controlled, the control for forming a loop of bonding wire, the control for determining a tail length, the control required for determining the length of bonding wire unreeled from a spool and other various controls can be effected correctly. As a result, the correct and highly reliable bonding operation can be carried out. Moreover, the wire bonding devices of the present invention can be driven with a small driving power so that motors compact in size and light in weight can be used and the wire bonding operation can be carried out at high speeds. Furthermore, there does not exist any play between parts so that the wire bonding operation can be carried out in a stable manner.

What is claimed is:

1. A wire bonding method of the type in which a bonding wire is supplied from a wire spool, and a bonding tool for holding the bonding wire at a portion adjacent to its leading end and a wire clamp for clamping said bonding wire at a position between said wire spool and said bonding tool are used to bond said bonding wire to a first bonding position on a semiconductor pellet and a second bonding position on an external terminal, thereby electrically interconnecting between said semiconductor pellet and said external terminal, said method comprising the steps of:

forming a ball at the leading end of said bonding wire;

lowering said bonding tool so that said ball of said bonding wire is bonded at said first bonding position;

closing said wire clamp to clamp said bonding wire, lowering said wire clamp while moving said bonding tool to said second bonding position, and drawing said bonding wire of a predetermined length from said bonding tool, said predetermined length being determined according to the distance between the first bonding position and the second bonding position;

lowering said bonding tool while moving said bonding tool to said second bonding position, and opening said wire clamp so that said bonding wire is bonded to said second bonding position; and closing said wire clamp to clamp said bonding wire, lifting said wire clamp to pull said bonding wire, and cutting said bonding wire at said second bonding position.

2. A method according to claim 1, further comprising the step of, immediately prior to the bonding of said bonding wire to said second bonding position, closing said wire clamp and moving said wire clamp away from said bonding tool so as to pull said bonding wire.

3. A method according to claim 2, wherein the velocity of said bonding tool moving from said first bonding position to said second bonding position, the vertical shifts and shifting velocities of said bonding tool, and the vertical shifts and shifting velocities of said wire clamp are determined based on the distance between said first bonding position and said second position.

4. A wire bonding device comprising:

a bonding tool for holding a bonding wire;

a main arm having a first end securely joined to said bonding tool, a second end comprising a first cam follower means and a supporting point disposed between said first and second ends, said main arm being able to swing on said supporting point;

an auxiliary arm having a first end securely joined to said supporting point of said main arm and a second end comprising a second cam follower means, said auxiliary arm being able to swing on said supporting point, the distance between said first cam follower means and said supporting point being substantially equal to the distance between said second cam follower means and said supporting point;

cam means, mounted on a cam shaft, for causing linear displacement of said first cam follower means in response to variations in the angle of rotation of the cam shaft and wherein the distance between said first and second cam follower means remains constant; and driving means for rotating said cam means about the axis of said cam shaft.

5. A device according to claim 4, wherein said main arm comprising:

a swinging arm having one end constituting said first cam follower means;

a bonding arm rotatably mounted to said swinging arm, said bonding arm having one end connected to said bonding tool; and holding means mounted on said swinging arm for holding said bonding arm by the electromagnetic force.

6. A device according to claim 5, wherein said cam means comprises a single cam disposed between said first and second cam follower means.

7. A device according to claim 5, wherein said cam means comprises a first cam in contact with said first cam follower means, and a second cam in contact with said second cam follower means, said first and second cams being mounted on said cam shaft.

8. A wire bonding device according to claim 4, wherein said driving means rotates said cam means at various controlled speeds.

9. A wire bonding device comprising:

a bonding tool for holding a bonding wire at a position adjacent to a leading end of said bonding tool, said bonding wire being supplied from a wire spool;

a wire clamp for clamping said bonding wire at a position between said wire spool and said bonding tool;

means for opening and closing said wire clamp;

first driving means for causing vertical movement of said bonding tool;

second driving means for causing vertical movement of said wire clamp independently of the vertical movement of said bonding tool; and said first driving means comprising:

a main arm having a first end securely joined to said bonding tool, a second end comprising a first cam follower means and a supporting point between said first and second ends, said main arm being able to swing on said supporting point;

an auxiliary arm having a first end securely joined to said supporting point of said main arm and a second end comprising a second cam follower means, said auxiliary arm being able to swing on said supporting point, the distance between said first cam follower means and said supporting point being substantially equal to the distance between said second cam follower means and said supporting point;

cam means, mounted on a cam shaft, for causing linear displacement of said first cam follower means in response to variations in the angle of rotation of a cam shaft and wherein the distance between said first and second cam follower means remains constant; and driving means for rotating said cam means about the axis of said cam shaft.

10. A device according to claim 9, wherein said main arm comprises:

a swinging arm having one end constituting a first cam follower means;

a bonding arm rotatably mounted to said swinging arm, said bonding arm having one end connected to said bonding tool; and holding means mounted on said swinging arm for holding said bonding arm by the electromagnetic force.

11. A device according to claim 10, wherein said cam means comprises a single cam disposed between said first and second cam follower means.

12. A device according to claim 10, wherein said cam means comprises a first cam in contact with said first cam follower means, and a second cam in contact with said second cam follower means, said first and second cams being mounted on said cam shaft.

13. A wire bonding device according to claim 9, wherein said second driving means comprises:

a main arm having a first end securely joined to said wire clamp, a second end comprising a first cam follower means and a supporting point between said first and second ends, said main arm being able to swing on said supporting point;

an auxiliary arm having a first end securely joined to said supporting point of said main arm and a second end comprising a second cam follower means, said auxiliary arm being able to swing on said supporting point, the distance between said first cam follower means and said supporting point being substantially equal to the distance between said second cam follower means and said supporting point;

cam means, mounted on a cam shaft, for causing linear displacement of said first cam follower means in response to variations in the angle of rotation of a cam shaft and wherein the distance between said first and second cam follower means remains constant; and driving means for rotating said cam means at various controlled speeds about the axis of said cam shaft.

14. A wire bonding device according to claim 9, wherein said driving means rotates said cam means at various controlled speeds.

15. A wire bonding device comprising:

a bonding tool for holding a bonding wire at a position adjacent to a leading end of said bonding tool, said bonding wire being supplied from a wire spool;

a wire clamp for clamping said bonding wire at a position between said wire spool and said bonding tool;

means for opening and closing said wire clamp;

first driving means for causing vertical movement of said bonding tool;

second driving means for causing the vertical movement of said wire clamp independently of the vertical movement of said bonding tool; and said second driving means comprising:

a main arm having a first end securely joined to said wire clamp, a second end comprising a first cam follower means and a supporting point between said first and second ends, said main arm being able to swing on said supporting point;

an auxiliary arm having a first end securely joined to said supporting point of said main arm and a second end comprising a second cam follower means; said auxiliary arm being able to swing on said supporting point, the distance between said first cam follower means and said supporting point being substantially equal to the distance between said second cam follower means and said supporting point;

cam means, mounted on a camshaft, for causing linear displacement of said first cam follower means in response to variations in the angle of rotation of a cam shaft and wherein the distance between said first and second cam follower means remains constant; and driving means for rotating said cam means about the axis of said cam shaft.

16. A wire bonding device according to claim 15, wherein said driving means rotates said cam means at various controlled speeds.

* * * * *